(12) United States Patent
Gebrael et al.

(10) Patent No.: US 12,342,449 B2
(45) Date of Patent: Jun. 24, 2025

(54) MULTILAYERED NONPOLAR, CHROMIUM, COPPER MATERIAL COATINGS OF POWER ELECTRONICS BOARDS FOR THERMAL MANAGEMENT

(71) Applicant: The Board of Trustees of the University of Illinois, Urbana, IL (US)

(72) Inventors: Tarek Gebrael, Champaign, IL (US); Arielle R. Gamboa, Urbana, IL (US); Jiaqi Li, Urbana, IL (US); Nenad Miljkovic, Urbana, IL (US); Shayan Aflatounian, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 269 days.

(21) Appl. No.: 17/953,744

(22) Filed: Sep. 27, 2022

(65) Prior Publication Data

US 2023/0103241 A1    Mar. 30, 2023

Related U.S. Application Data

(60) Provisional application No. 63/249,287, filed on Sep. 28, 2021.

(51) Int. Cl.
| | |
|---|---|
| *H05K 1/02* | (2006.01) |
| *C23C 14/04* | (2006.01) |
| *C23C 14/20* | (2006.01) |
| *C23C 14/24* | (2006.01) |
| *C23C 14/34* | (2006.01) |

(Continued)

(52) U.S. Cl.
CPC ......... *H05K 1/0209* (2013.01); *C23C 14/042* (2013.01); *C23C 14/205* (2013.01); *C23C 14/24* (2013.01); *C23C 14/34* (2013.01); *C23C 18/1605* (2013.01); *C23C 18/38* (2013.01);

(Continued)

(58) Field of Classification Search
None
See application file for complete search history.

(56) References Cited

U.S. PATENT DOCUMENTS

| | | | | |
|---|---|---|---|---|
| 4,466,874 A | * | 8/1984 | Belke, Jr. ............. | H10N 30/877 204/192.15 |
| 4,699,811 A | * | 10/1987 | Kunces ................. | C25D 5/022 216/48 |

(Continued)

OTHER PUBLICATIONS

Original and Translation (Year: 2015).*

(Continued)

*Primary Examiner* — Binh B Tran
*Assistant Examiner* — Muhammed Azam
(74) *Attorney, Agent, or Firm* — Lowenstein Sandler LLP

(57) ABSTRACT

An apparatus includes a printed circuit board (PCB), a power component disposed on the PCB, the power component to generate heat, and a multilayered coating disposed over the power component and at least a portion of the PCB to dissipate heat from the power component, the multilayered including: an electrical insulation layer comprising a non-polar compound and disposed on the power component and the at least a portion of the PCB; a chromium layer disposed on the electrical insulation layer; and a copper layer disposed on the chromium layer that is at least 10 microns (μm) thick, the copper layer conformally adhered to a top of the power component and to the PCB.

25 Claims, 10 Drawing Sheets

(51) Int. Cl.
  *C23C 18/16* (2006.01)
  *C23C 18/38* (2006.01)
  *C23C 28/02* (2006.01)
  *C25D 3/38* (2006.01)
  *C25D 7/00* (2006.01)
  *H05K 3/22* (2006.01)

(52) U.S. Cl.
  CPC .............. *C23C 28/023* (2013.01); *C25D 3/38* (2013.01); *C25D 7/00* (2013.01); *H05K 3/22* (2013.01)

(56) References Cited

U.S. PATENT DOCUMENTS

| | | | | |
|---|---|---|---|---|
| 4,707,586 | A * | 11/1987 | Voss | C23C 28/00 219/466.1 |
| 4,768,286 | A * | 9/1988 | Ketcham | H05K 3/30 29/841 |
| 5,060,114 | A * | 10/1991 | Feinberg | H01L 23/552 257/E23.09 |
| 5,221,426 | A * | 6/1993 | Tessier | H01L 21/32131 438/669 |
| 5,250,363 | A * | 10/1993 | Chen | H05K 3/384 428/607 |
| 5,372,685 | A * | 12/1994 | Anschel | C23C 14/205 204/192.15 |
| 5,389,446 | A * | 2/1995 | Yamanishi | H05K 3/384 428/656 |
| 5,465,009 | A * | 11/1995 | Drabik | H01L 24/96 257/723 |
| 5,572,070 | A * | 11/1996 | Ross | H01L 23/42 257/713 |
| 5,863,410 | A * | 1/1999 | Yates | H05K 3/384 205/296 |
| 5,898,572 | A * | 4/1999 | Shennib | G11B 33/08 360/99.18 |
| 6,171,714 | B1 * | 1/2001 | Bergkessel | C23C 14/562 428/626 |
| 6,183,886 | B1 * | 2/2001 | Chen | C23C 28/021 428/658 |
| 6,407,922 | B1 * | 6/2002 | Eckblad | H01L 23/373 257/E23.09 |
| 6,489,034 | B1 * | 12/2002 | Wang | C23C 28/321 204/192.1 |
| 6,489,035 | B1 * | 12/2002 | Wang | H05K 1/167 205/333 |
| 6,690,578 | B2 * | 2/2004 | Edelmann | H05K 7/20454 174/15.1 |
| 6,757,170 | B2 * | 6/2004 | Lee | H01L 23/42 165/185 |
| 6,763,576 | B2 | 7/2004 | Watchko et al. | |
| 6,965,071 | B2 * | 11/2005 | Watchko | C23C 4/12 174/388 |
| 7,035,031 | B2 | 4/2006 | Kim et al. | |
| 7,446,263 | B2 * | 11/2008 | En | C25D 3/38 361/764 |
| 7,619,893 | B1 | 11/2009 | Yu | |
| 8,152,985 | B2 * | 4/2012 | Macary | C23C 18/1834 205/205 |
| 8,624,123 | B2 | 1/2014 | Heo et al. | |
| 9,055,700 | B2 * | 6/2015 | Humphries | H05K 3/282 |
| 9,150,977 | B2 * | 10/2015 | Kim | C25D 3/38 |
| 9,226,428 | B2 * | 12/2015 | Pidwerbecki | G06F 1/1656 |
| 9,282,630 | B2 * | 3/2016 | Merz | H05K 1/0216 |
| 9,596,788 | B1 * | 3/2017 | Lai | H01L 23/3731 |
| 9,781,842 | B2 * | 10/2017 | Tai | H05K 3/4038 |
| 9,901,009 | B2 * | 2/2018 | Sugita | H05K 7/205 |
| 9,905,857 | B1 * | 2/2018 | Gross | H01M 4/745 |
| 10,057,983 | B1 * | 8/2018 | Etzkorn | G02B 3/00 |
| 10,120,423 | B1 * | 11/2018 | Urban | G06F 1/1656 |
| 10,264,710 | B2 * | 4/2019 | Penttinen | H05K 1/0209 |
| 10,295,710 | B2 * | 5/2019 | Pham | B30B 5/04 |
| 10,312,177 | B2 * | 6/2019 | Zhang | C09K 5/063 |
| 10,428,256 | B2 * | 10/2019 | Shen | H01L 24/32 |
| 10,443,142 | B2 * | 10/2019 | Miettinen | C25D 5/14 |
| 10,487,412 | B2 * | 11/2019 | Miettinen | C25D 3/06 |
| 10,674,641 | B2 * | 6/2020 | Shepard | H05K 7/203 |
| 10,837,117 | B2 * | 11/2020 | Zimmermann | C25D 3/562 |
| 11,692,271 | B2 * | 7/2023 | Miljkovic | C23C 16/401 427/248.1 |
| 11,866,536 | B2 * | 1/2024 | Kitai | B32B 15/20 |
| 2002/0197492 | A1 * | 12/2002 | Hao | C25D 5/022 428/457 |
| 2003/0066672 | A1 | 4/2003 | Watchko et al. | |
| 2003/0152764 | A1 * | 8/2003 | Bunyan | H01L 23/4275 428/328 |
| 2004/0256408 | A1 * | 12/2004 | Chen | C23C 28/023 222/1 |
| 2005/0016714 | A1 * | 1/2005 | Chung | F28F 13/00 428/323 |
| 2005/0051489 | A1 * | 3/2005 | Tai | H05K 3/284 210/656 |
| 2007/0009968 | A1 * | 1/2007 | Cunningham | G02B 6/1225 435/7.9 |
| 2009/0139640 | A1 * | 6/2009 | Treutlein | D21H 21/40 156/233 |
| 2009/0205853 | A1 * | 8/2009 | Larsson | H05K 3/387 427/535 |
| 2009/0297840 | A1 * | 12/2009 | Larsson | H05K 1/03 428/464 |
| 2010/0140790 | A1 | 6/2010 | Setiadi et al. | |
| 2014/0255722 | A1 * | 9/2014 | Nagarajan | C23C 18/1653 428/626 |
| 2016/0223269 | A1 * | 8/2016 | Hartmann | B32B 27/00 |
| 2017/0314153 | A1 * | 11/2017 | Ijeri | C25D 21/14 |
| 2019/0032235 | A1 * | 1/2019 | Hashimoto | C23C 18/30 |
| 2023/0103241 | A1 * | 3/2023 | Gebrael | C23C 14/34 361/708 |

OTHER PUBLICATIONS

Original and Translation of FR2713396 (Year: 1995).*
Ortigoza-Diaz et al., "Techniques and considerations in the microfabrication of Parylene C microelectromechanical systems", Micromachines, vol. 9, No. 422, 25 pages, 2018.
Pallo et al., "Power-dense multilevel inverter module using interleaved GaN-based phases for electric aircraft propulsion", in 2018 IEEE Applied Power Electronics Conference and Exposition (APEC), p. 1656-1661, 2018.
Popescu et al., "Modern heat extraction systems for power traction machines—A review", IEEE Transactions on Industry Applications, vol. 52, No. 33, p. 2167-2175, May/Jun. 2016.
Razavi et al., "Review of advances in thermal spreading resistance problems", Journal of Thermophysics and Heat Transfer, vol. 30, No. 4, p. 863-879, Oct.-Dec. 2016.
Schmidt, et al., "Applications for silica aerogel products", Journal of non-crystalline solids, vol. 225, p. 364-368, 1998.
Seelmann-Eggebert et al., "Heat-spreading diamond films for GaN-based high-power transistor devices", Diamond and Related Materials, vol. 10, p. 744-749, 2001.
Sheynkin et al., "Increase in scrotal temperature in laptop computer users", Human reproduction, vol. 20, No. 2, p. 452-455, 2005.
Shi et al., "Functional soft composites as thermal protecting substrates for wearable electronics", Advanced Functional Materials, vol. 29 8 pages, 2019.
Smalc et al., "Thermal performance of natural graphite heat spreaders", in International Electronic Packaging Technical Conference and Exhibition, 11 pages, 2005.
Sridhar et al. "3D-ICE: Fast compact transient thermal modeling for 3D ICs with inter-tier liquid cooling", in 2010 IEEE/ACM International Conference on Computer-Aided Design (ICCAD) IEEE, 8 pages, 2010.
Tong, X.C., "Thermal management fundamentals and design guides in electronic packaging", in Advanced Materials for Thermal Management of Electronic Packaging, Springer, p. 1-58, 2011.
Tsai et al., "Experimental studies of thermal resistance in a vapor chamber heat spreader", Applied Thermal Engineering, vol. 56, p. 38-44, 2013.

(56) References Cited

OTHER PUBLICATIONS

Tsukamoto et al., "Micro thermal diode with glass thermal insulation structure embedded in a vapor chamber", Journal of Micromechanics and Microengineering, vol. 27, p. 1-8, 2017.
Ventola et al., "Rough surfaces with enhanced heat transfer for electronics cooling by direct metal laser sintering", International Journal of Heat and Mass Transfer, vol. 75, p. 58-74, 2014.
Wang et al., "A critical review of thermal management models and solutions of lithium-ion batteries for the development of pure electric vehicles", Renewable and Sustainable Energy Reviews, vol. 64, p. 106-128, 2016.
Wen, et al., "Application of a thermally conductive pyrolytic graphite sheet to thermal management of a PEM fuel cell", Journal of Power Sources, vol. 178, p. 132-140, 2008.
Xie et al., "Therminator: a thermal simulator for smartphones producing accurate chip and skin temperature maps", in Proceedings of the 2014 international symposium on Low power electronics and design, p. 117-122, 2014.
Yang et al., "Performance characteristics of pulsating heat pipes as integral thermal spreaders", International Journal of Thermal Sciences, vol. 48, p. 815-824, 2009.
Yang et al., "Millimeter-scale liquid metal droplet thermal switch", Applied Physics Letters, vol. 112, 6 pages, 2018.
Youn et al., "Fabrication and evaluation of a slicon-based micro pulsating heat spreader", Sensors and Actuators A: Physical, vol. 174, p. 189-197, 2012.
Zhang et al., "Laptop heat and models of user thermal discomfort", in Proceedings of the Human Factors and Ergonomics Society Annual Meeting, SAGE Publications Sage CA: Los Angeles, CA, p. 1456-1460, 2014.
Zhang et al., "3D Bridged Carbon Nanoring/Graphene Hybrid Paper as a High-Performance Lateral Heat Spreader", Small, vol. 11, No. 46, p. 6197-6204, 2015.
Zhang et al., "Recent advancements on thermal management and evaluation for data centers", Applied Thermal Engineering, vol. 142, p. 215-231, 2018.
https://scscoatings.com/equipment/product-lines/parylene-coating-equipment/labcoter/.
http://www.ajaint.com/atc-orion-series-sputtering-systems.html.
https://www.caswellplating.com/electroplating-anodizing/electroless-plating-kits/electrolesscopper-plating-kits/electroless-copper-kit-1-quart.html.
https://www.allaboutcircuits.com/technical-articles/pcb-thermal-management-techniques/.
Casswell, Inc., "Safety Data Sheet Electroless Copper Sensitizer", Caswell Safety Manual, v. 1.0, 7 pages, Sep. 16, 2015.
Casswell, Inc., "Safety Data Sheet Electroless Copper Part B", Caswell Safety Manual, v. 1.0, 9 pages, Nov. 10, 2016.
Casswell, Inc., "Safety Data Sheet Electroless Copper Part A", Caswell Safety Manual, v. 1.0, 8 pages, Nov. 10, 2016.
Casswell, Inc., "Safety Data Sheet Electroless Copper Activator", Caswell Safety Manual, v. 1.0, 7 pages, Sep. 16, 2015.
Efficient Power Conversion Corporation, Thermal Model of EPC2029, EPC2030, EPC2030, EPC2031, EPC2032, EPC2033 and EPC2034®, The eGaN FET Journey Continues, downloaded Oct. 6, 2022, 8 pages.
FloTHERM Suite by Mentor Graphics Corporation. 2017 [cited 2020; Available from: https://s3.amazonaws.com/s3.mentor.com/public_documents/datasheet/products/mechanical/products/flotherm.pdf.
EPC2034—Enhancement Mode Power Transistor Datasheet by Efficient Power Conversion Corporation (EPC), 2020, available from: https://epc-co.com/epc/Portals/0/epc/documents/datasheets/EPC2034_datasheet.pdf.
Lasance, C.J.M., "Heat Spreading: Not a Trivial Problem", 2008, cited 2020, available from: http://www.electronics-cooling.com/2008/05/heat-spreading-not-a-trivial-problem/.
Anandan, S.S.et al., "Thermal management of electronics: A review of literature", Thermal Science, vol. 12, No. 2, p. 5-26, 2008.

Bae, S.-H., et al., "Graphene-based heat spreader for flexible electronic devices", IEEE Transactions on Electron Devices, vol. 61, No. 12, p. 4171-4175, Dec. 2014.
Bhavnani, S.H. et al., "Effect of surface geometry and orientation on laminar natural convection heat transfer from a vertical flat plate with transverse roughness elements", International Journal of Heat and Mass Transfer, vol. 33, No. 5, p. 965-981, 1990.
Birbarah et al, "Water immersion cooling of high power density electronics", International Journal of Heat and Mass Transfer, 147, Feb. 2020.
Boreyko et al., "Planar jumping-drop thermal diodes", Applied Physics Letters, 99(23): p. 234105, 2011.
Chen et al., "Topology optimization for efficient heat removal in 3D packages", in 2016 15th IEEE Intersociety Conference on Thermal and Thermomechanical Phenomena in Electronic Systems (ITherm), 7 pages, 2016.
Chiou, et al., "Phone-nomenon: A system-level thermal simulator for handheld devices", in Proceedings of the 24th Asia and South Pacific Design Automation Conference, 6 pages, 2019.
Chiriac, et al., "A Figure of Merit for Smart Phone Thermal Management", Electronics COOLING, p. 18-23, Dec. 2015.
Cho, et al., "Evaluation of contacts for a MEMS thermal switch", Journal of Micromechanics and Microengineering, vol. 18, No. 10, p. 1-6, 2008.
Churchill et al., "Correlating equations for laminar and turbulent free convection from a vertical plate", International journal of heat and mass transfer, vol. 18, No. 11, p. 1323-1329, 1975.
Deckard, et al. "Convergence and validation in ParaPower: A design tool for phase change materials in electronics packaging", in 2019 18th IEEE Intersociety Conference on Thermal and Thermomechanical Phenomena in Electronic Systems (ITherm), 8 pages, 2019.
Dorcheh et al., "Silica aerogel; synthesis, properties and characterization", Journal of materials processing technology, vol. 199(1-3): p. 10-26, 2008.
Ebrahimi et al., "A review of data center cooling technology, operating conditions and the corresponding low-grade waste heat recovery opportunities", Renewable and Sustainable Energy Reviews, vol. 31, p. 622-638, 2014.
Fabis et al., "Thermal management enhancement for GaAs Devices using CVD diamond heat spreaders in a plastic package environment", Journal Electronic Packaging, vol. 122, p. 92-97, Jun. 2000.
Foulkes, et al., "Jumping droplets electronics cooling: Promise versus reality", Applied Physics Letters, 116(20), 6 pages, 2020.
Gao, et al., "Thermal chemical vapor deposition grown graphene heat spreader for thermal management of hot spots", Carbon, vol. 61, p. 342-348, 2013.
Gebrael, et al., "High-efficiency cooling via the monolithic integration of copper on electronic devices", Nature Electronics, vol. 5, p. 394-402, Jun. 2022.
Gebrael, et al., "Self-sustained thermally induced gas-damped oscillations of bimetal cantilevers with application to the design of a new pyroelectric micro energy harvester", Journal of Physics D: Applied Physics, vol. 53, No. 19, 20 pages, 2020.
Gillot, et al., "Silicon heat pipes used as thermal spreaders", IEEE transactions on components and packaging technologies, vol. 26, No. 2, p. 332-339, Jun. 2003.
Han et al., "Thermal management of hotspots using diamond heat spreader on Si microcooler for GaN devices", IEEE Transactions on Components, Packaging and Manufacturing Technology, vol. 5, No. 12, p. 1740-1746, Dec. 2015.
Hu, et al., "Battery warm-up methodologies at subzero temperatures for automotive applications: Recent advances and perspectives", Progress in Energy and Combustion Science, 77: 28 pages, 2020.
Huang, et al., "Compact thermal modeling for temperature-aware design", in Proceedings of the 41st annual Design Automation Conference, pp. 878-883, Jun. 2004.
Huang, et al., "Temperature-aware architecture: Lessons and opportunities", IEEE Micro, vol. 31, No. 3, p. 82-86, 2011.
Humphries et al., "A design handbook for phase change thermal control and energy storage devices", NASA Space and Technical Information Office, Technical Paper 1074, 256 pages, 1977.

(56) References Cited

OTHER PUBLICATIONS

Kandasamy et al., "Application of phase change materials in thermal management of electronics", Applied Thermal Engineering, vol. 27, p. 2822-2832, 2007.

Khalaj et al., "A Review on efficient thermal management of air-and liquid-cooled data centers: From chip to the cooling system", Applied energy, vol. 205: p. 1165-1188, 2017.

Khalkhali, et al., "Electronics warming and optimization study subject to low temperature environments", in 2006 8th Electronics Packaging Technology Conference, p. 340-345, 2006.

Kheirabadi et al., "Cooling of server electronics: A design review of existing technology", Applied Thermal Engineering, vol. 105, p. 622-638, 2016.

Kim et al., "Micromachining of Parylene C for bioMEMS", Polymers for Advanced Technologies, vol. 27, No. 5, p. 564-576, 2016.

Lee et al., "Diamond heat spreaders for submillimeter-wave gas Schottky diode frequency multipliers", in International Symposium on Space Terahertz Technology, p. 43-46, 2009.

Lee et al., "An electrochemical system for efficiently harvesting low-grade heat energy", Nature communications, vol. 5, No. 1, p. 1-6, 2014.

Li et al., "Thermal management of micro-scale inorganic light-emitting diodes on an orthotropic substrate for biointegrated applications", Scientific reports, vol. 7, No. 1. p. 1-12, 2017.

Ligrani et al., "Flow structure and local Nusselt number variations in a channel with dimples and protrusions on opposite walls", International Journal of Heat and Mass Transfer, vol. 44, No. 23, p. 4413-4425, 2001.

Lim et al., "Fabrication and experimental evaluation of a polymer-based flexible pulsating heat pipe", Energy Conversion and Management, vol. 156, p. 358-364, 2018.

Lohan et al., "Topology optimization formulations for circuit board heat spreader design", in 17th AIAA/ISSMO Multidisciplinary Analysis and Optimization Conference, p. 1-8, Jun. 2016.

Lu et al., "A graphite foams based vapor chamber for chip heat spreading", Journal of Electronic Packaging, vol. 128, p. 427-431, Dec. 2006.

Nedumthakady et al., "Integrated copper heat spreaders in glass panel embedded packages with near-zero thermal interface resistance", in 2018 IEEE 68th Electronic Components and Technology Conference (ECTC), p. 2013-2018, 2018.

Nittala et al., "Enabling Transfer of Ultrathin Layers of GaN for Demonstration of a Heterogenous Stack on Copper Heat Spreader", IEEE Transactions on Components, Packaging and Manufacturing Technology, vol. 10, No. 2, p. 339-342, Feb. 2020.

Tong, X.C., "Materials and Design for Advanced Heat Spreader and Air Cooling Heat Sinks," Advanced Materials for Thermal Management of Electronic Packaging, Springer Series in Advanced Microelectronics 30, Chapter 9, pp. 373-420, 2011.

\* cited by examiner

Adhesion Promoter/Parylene C Deposition

Chromium/Copper Thermal Evaporation

Copper Electroless Deposition

Copper Electroplating

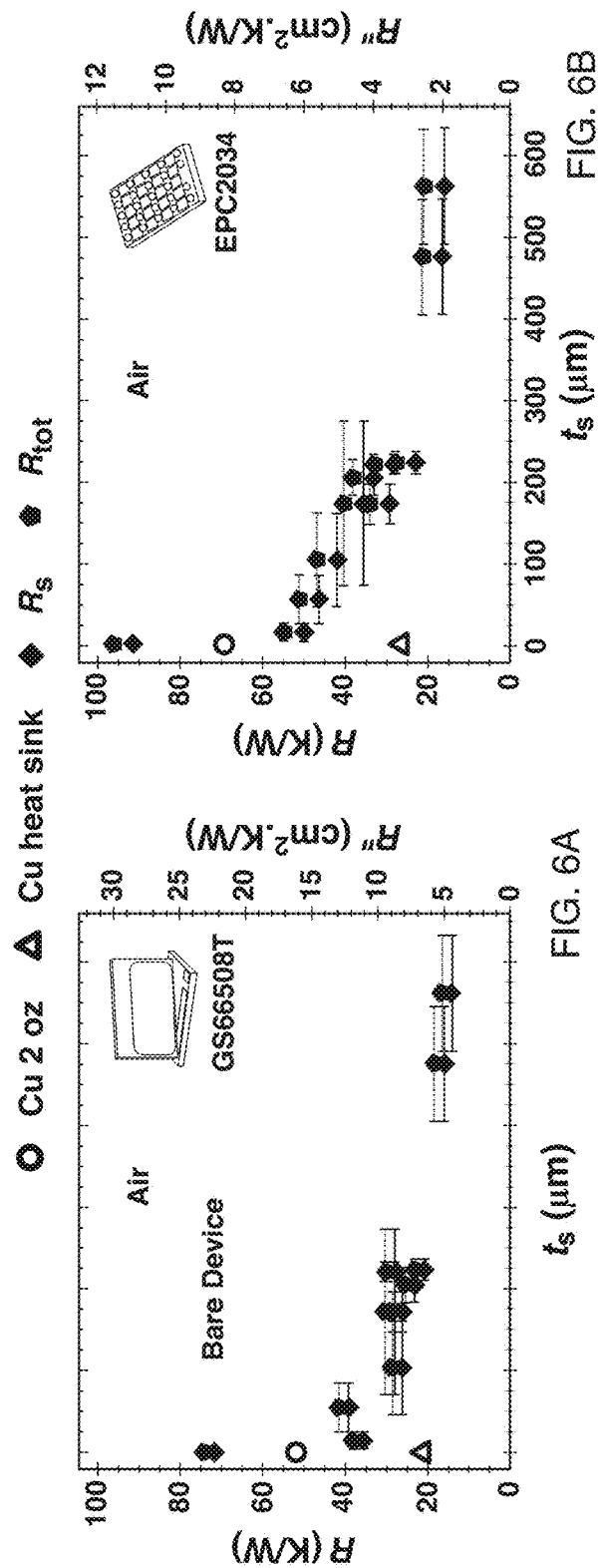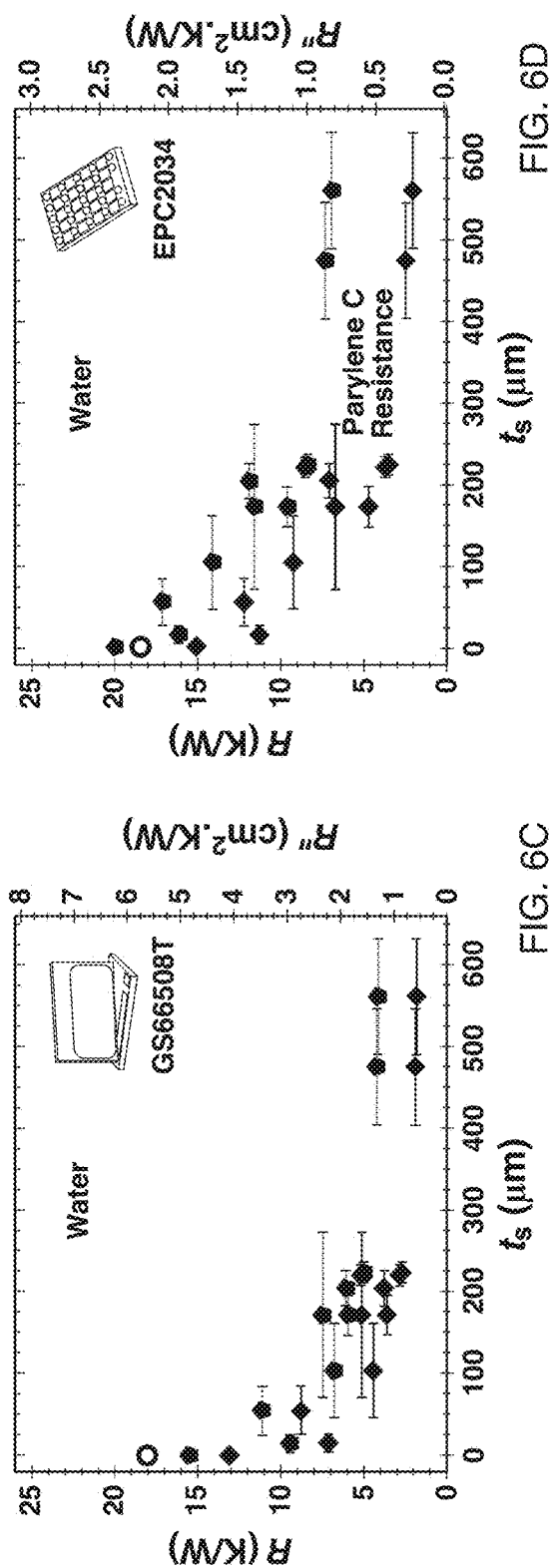

MULTILAYERED NONPOLAR, CHROMIUM, COPPER MATERIAL COATINGS OF POWER ELECTRONICS BOARDS FOR THERMAL MANAGEMENT

CLAIM OF PRIORITY

The present application claims the benefit under 35 U.S.C. § 119(e) of U.S. Provisional Patent Application No. 63/249,287, filed Sep. 28, 2021, which is incorporated by reference herein.

TECHNICAL FIELD

Embodiments of the disclosure relate generally to power electronics, and more specifically, relate to a thermal coating of power electronics boards for thermal management.

BACKGROUND

Power electronics and constituent power components refer to electronic circuits and system used in the control and conversion of electric power. One main challenge in power electronics densification is thermal management, e.g., the removal of heat generated to keep the electronics or components under the temperature for which the electronics or components are rated. If power electronics and associated power components are not sufficiently cooled, the power electronics and associated power components can be damaged or stressed so as to have to be discarded sooner than a typical useful life. One of the largest applications of thermal management technology is in data centers where servers and super computers share loads in the cloud and need to be cooled constantly.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIGS. 6A-6B are graphs of thermal resistance versus copper coating thickness in two separate experiments performed in air at room temperature, respectively, according to some embodiments.

FIGS. 6C-6D are graphs of thermal resistance versus copper coating thickness in two separate experiments performed in water at room temperature, respectively, according to some embodiments.

DETAILED DESCRIPTION

By way of introduction, the present disclosure describes a process for creation of multilayered coatings that cover power electronics and/or power components disposed on printed circuit boards (PCBs) to provide thermal management of these power electronics boards. The multilayered coatings can be selectively customized for a certain area of a PCB on which is disposed power electronics such as power transistors, converters, and inverters used for power conversion. In various embodiments, these multilayered coatings are used as not only for cooling heat spreaders, but also as temperature stabilizers, heat shields, and heat routers in myriad of electro-thermal applications as will be discussed in more detail with reference to the following Figures. These power electronics boards or PCBs can be incorporated as an apparatus, device, or system focused on dissipating heat, shielding heat, diverting heat, and other thermal management configurations. Other embodiments and associated uses and advantages thereof will be discussed in more detail.

Figure 1A:
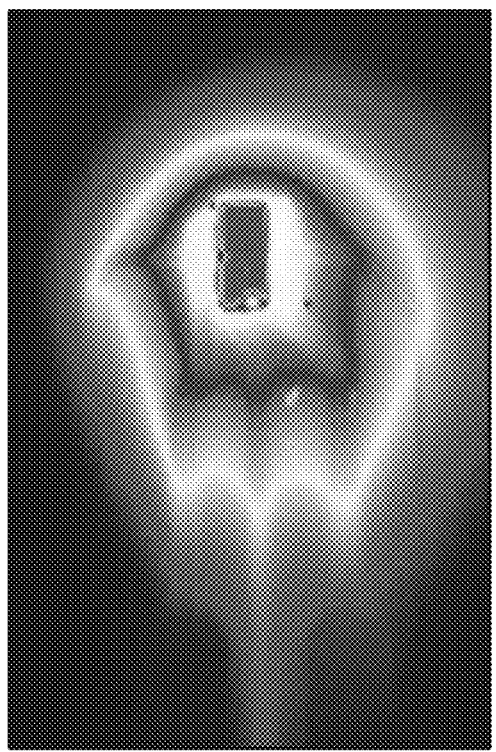
FIG. 1A is a portion of printed circuit board (PCB) on which is disposed a power component such as a power transistor, according to an embodiment.

FIG. 1A is a portion of printed circuit board (PCB) 101 on which is disposed a power component 103 such as a power transistor, according to an embodiment, although other power devices or components are also envisioned. In one embodiment, the power transistor is a gallium nitride (GaN) transistor, GS66508T, which is merely mentioned by way of example and was used for experimentation. Copper (Cu) has a high thermal conductivity, about 400 Watts/meter-Kelvin (W/mK), and therefore, copper coatings spread heat significantly in the lateral direction. Heat spreading leads to a high transfer surface area, e.g., lower thermal resistance, and hence results in a lower power component temperature under the same power operating condition, as expressed in Equation (1), $$T_{surface} = T_{ambient} + \text{Heat} * \frac{1}{h * \text{area}}, \quad (1)$$

where h is the heat transfer coefficient of copper, for example, and the area is the heat spreading area of the copper layers. The apparatus or device illustrated in FIG. 1A can also include a power source where the power component 103 is to generate heat when powered by the power source.

Figure 1B:
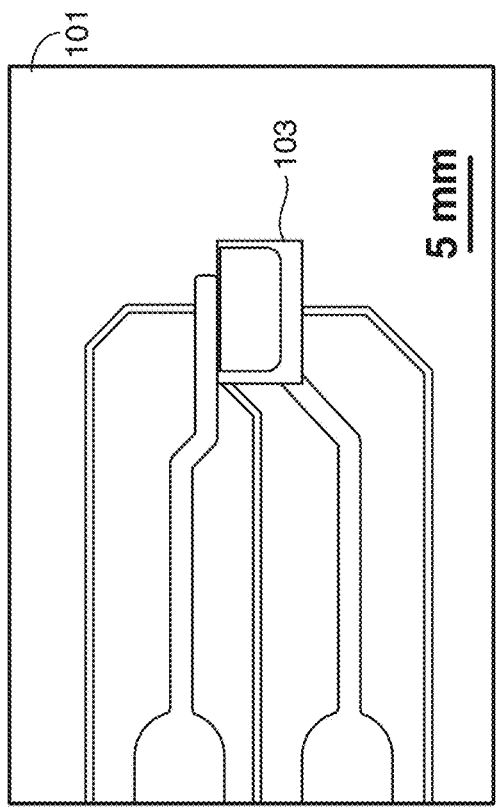
FIG. 1B is an infrared thermography image of the PCB and power component of FIG. 1A without a thermal coating according to an embodiment.
Figure 1C:
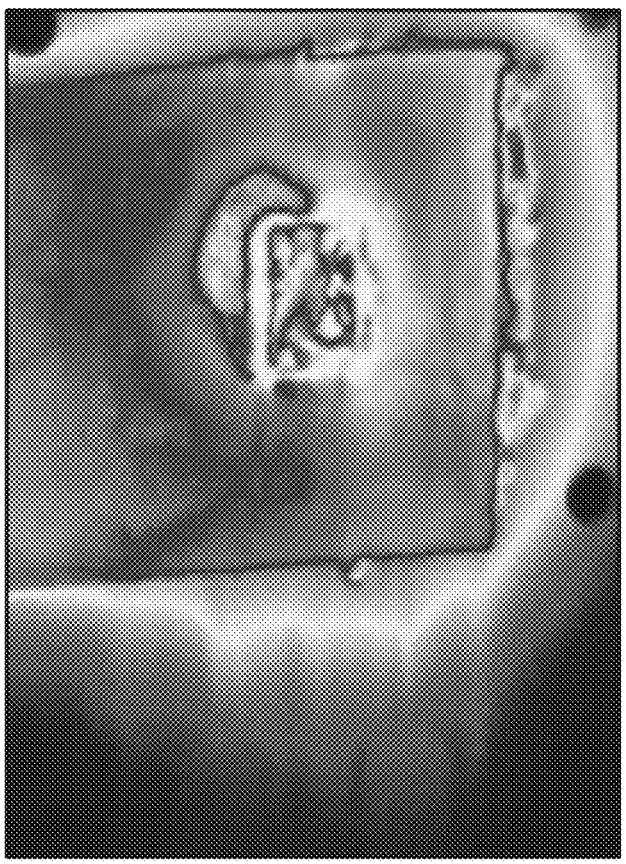
FIG. 1C is an infrared thermography image of the PCB and power component of FIG. 1A with a thermal coating in room temperature air according to an embodiment.

FIG. 1B is an infrared thermography image of the PCB and power component of FIG. 1A without a thermal coating according to an embodiment. This conventional PCB and power component is not coated and, as can be observed, includes a high heat signature closely surrounding the power transistor without much heat transfer outside of this adjacent region. FIG. 1C is an infrared thermography image of the PCB and power component of FIG. 1A with a thermal coating in room temperature air according to an embodiment. As illustrated, with use of the disclosed thermal coating, the power transistor is greatly cooled and pushes medium to high levels of heat throughout the multilayered thermal coating. In this way, the multilayered thermal coating serves as a heat spreader.

FIGS. 2A-2D are diagrams of operations of a process flow for coating a PCB 200 and a power component 203 according to at least some embodiments. FIG. 3 is a flow diagram of a method 300 for coating the PCB 200 and the power component 203 according to at least some embodiments, where the operations of method 300 correspond to the illustrations of FIGS. 2A-2D, and will thus be jointly discussed.

Figure 2A:
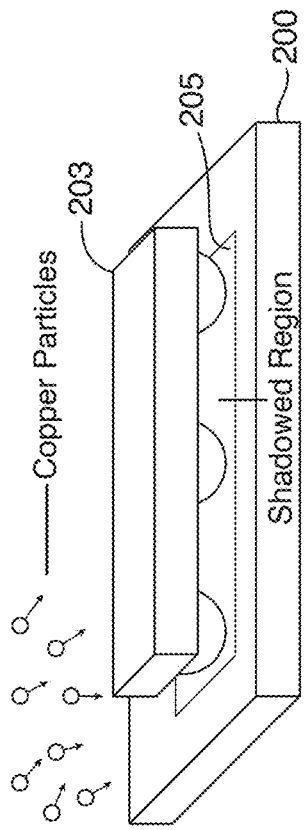
FIGS. 2A-2D are diagrams of operations of a process flow for coating a PCB and power component according to at least some embodiments.

Operation 310 of the method 300, as illustrated in FIG. 2A, includes coating the power component 203 and at least a portion of the PCB 200 on which the power component is disposed with an electrical insulation layer 210 (see FIGS. 2C-2D) composed of a non-polar compound. Although Parylene C is illustrated and employed for experimental purposes, in various embodiments, the electrical insulation layer 210 is a non-polar dielectric, Parylene C, Parylene HT, or Parylene N.

The operations can also include, in part, applying an adhesion promoter for the electrical insulation layer first, and then performing the coating of the power component 203 and the PCB 200 with the electrical insulation layer 219 on the adhesion promoter (not illustrated) within 30 hours of applying the adhesion promoter. The adhesion promoter can be A-174 Silane, also known as gamma-methacryloxypropyltrimethoxysilane (γ-MPS). The adhesion promoter and the electrical insulation layer can be deposited on exposed circuit traces and devices to protect them from later-deposited copper layers.

In some embodiments, the adhesion promoter is deposited through the following operations, including: (1) preparing a promotion solution containing isopropyl alcohol (IPA), deionized (DI) water and A-174 in 100:100:1 volume ratio; (2) stirring the solution with a clean stirring rod for 30 seconds; (3) allowing the solution to stand for two hours before using the solution; (4) submerging the PCB 200 and power electronics in the prepared promotion solution for 15-30 minutes; (5) removing the PCB/power electronics from the solution; (6) allowing the PCB/power electronics to dry for 15-30 minutes; (7) submerging the PCB/power electronics in IPA for 15-30 seconds; (8) agitating the container several times; and (9) drying with nitrogen ($N_2$). Other processes for depositing the adhesion promoter are envisioned, as this set of operations is merely exemplary. The PCB/power electronics should be coated with Parylene C within approximately 30 hours. If the PCB/power electronics are not coated in this time, the promotion process can be repeated. Although PCB is generally referred to, it should be understood that an entire board may not be coated, but only a select area of the PCB that holds the power electronics and is sufficiently large to function as a heat spreader.

In these embodiments, the electrical insulation layer 210 is then deposited on the PCB 200 through a chemical vapor deposition (CVD) process. The electrical insulation layer 210 acts as the insulating barrier that prevents the overlying chromium and copper coatings (see below) from short-circuiting the electronics. In some embodiments, the electrical insulation layer 210 is 7 to 11 microns (μm) thick. In one embodiment, the electrical insulation layer 210 is approximately 8.50 μm thick. Although specific thicknesses of different parts of the multilayered thermal coatings are disclosed by way of example, additional thickness in multiples of microns ranges are envisioned as would be apparent to those skilled in the art.

In some embodiments, the operations can further include, before the coating of the PCB/power electronics with the electrical insulation layer 210, covering select components disposed on, and select areas of, the PCB with a polyimide adhesive tape such as Kapton® tape. The polyimide adhesive tape can protect the select components and select areas where electrical connections are to be accessed during later PCB operations. For example, the copper layers can penetrate through a solder mask layer of the PCB and short-circuit the underlying copper traces if not protected.

Figure 2B:
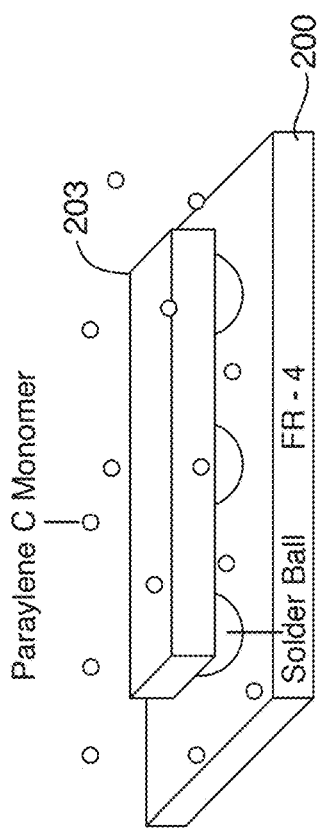

Operation 320 of the method 300, as illustrated in FIG. 2B, includes depositing, using one of thermal evaporation or sputtering, a chromium layer 220 on the electrical insulation layer 210. Thermal evaporation can be understood to be physical vapor deposition (PVD). In some embodiments, the chromium (Cr) layer is from 10 to 30 nanometer (nm) thick. In one embodiment, the chromium layer is 20 nm thick. Although specific thicknesses are disclosed by way of example, additional thickness in tens of nanometer ranges are envisioned as would be apparent to those skilled in the art.

Operation 330 of the method 300, as illustrated in FIG. 2B, includes depositing, using one of thermal evaporation or sputtering, a first copper layer 230 on the chromium layer 220. The thermal evaporation can be understood to be PVD, or sputtering can be used. Either thermal evaporation or sputtering generally coats a thin layer of particles with a line-of-sight coverage that can leave a shadowed region 205 below the power component 203, for example. In some embodiments, the first copper layer 230 (or thermally-evaporated copper layer) is 40 to 60 nm thick. In one embodiment, the first copper layer 230 is approximately 50 nm thick. The chromium layer 220 acts as an adhesion promoter or kick-starter for the first copper layer. Although specific thicknesses are disclosed by way of example, additional thickness in tens of nanometer ranges are envisioned as would be apparent to those skilled in the art.

In some embodiments, the method 300 further includes, before the PCB/power electronics are coated with the chromium and copper layers in operations 320 and 330, covering a region of the PCB with a mask that is not to be layered with the chromium and copper layers. This mask can selectively ensure that some areas of, and components disposed on, the PCB are not covered so that these areas can be selectively excluded from the multilayered coating depending on the application and use of the multilayered coating according to various shieling embodiments that will be discussed later. In some embodiments, a Denton DV-502A vacuum evaporator (Denton Vacuum LLC) was used to perform operations 320 and 330 for purposes of experimentation. Coatings were performed at less than $4\times10^{-6}$ Torr, with chromium (Cr) application at a ca. 90 ampere (A) current and 1.9 to 2.8 Å/s deposition rates and copper (Cu) application at ca. 80 A and 15 Å/s.

Figure 2C:
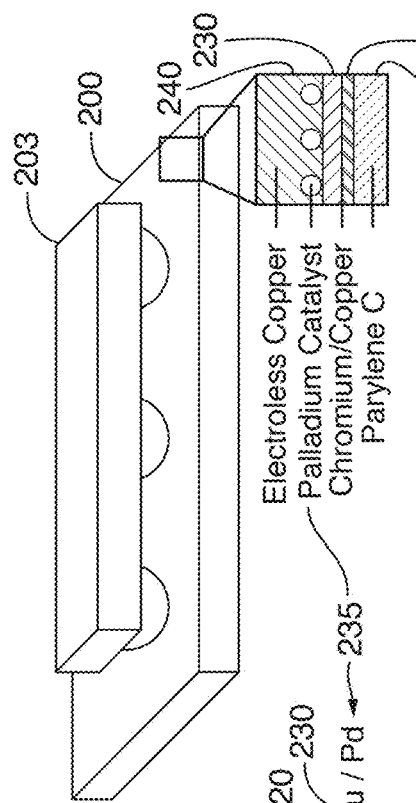
Figure 3:
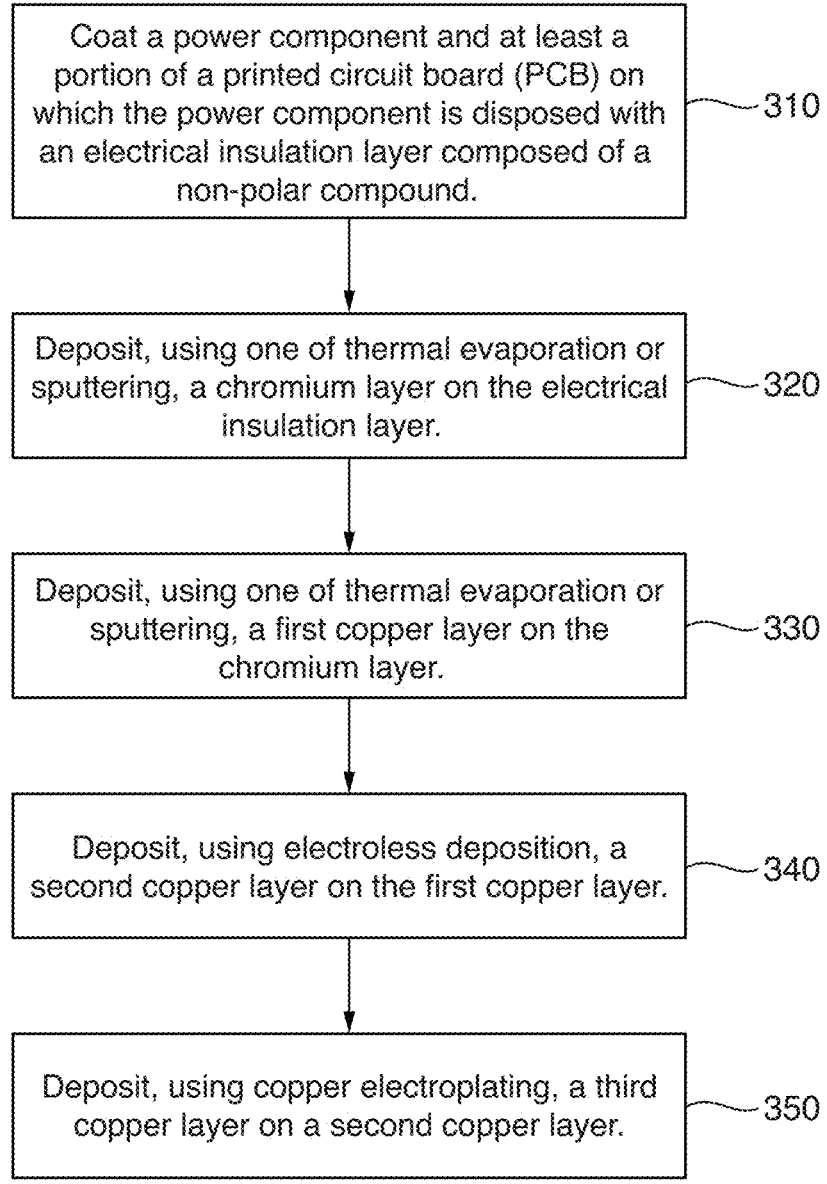
FIG. 3 is a flow diagram of a method for coating a PCB and a power component according to at least some embodiments.

Operation 340 of the method 300, as illustrated in FIG. 2C, includes depositing, using electroless deposition, a second copper layer 240 on the first copper layer 230. In some embodiments, a electroless copper kit is used in this operation to bridge the copper deposited in operation 330 and form a continuous conformal copper layer that covers the PCB 200 as well as the underside of the power component 203 and/or other power electronics. This electroless copper kit may include the use of a Palladium catalyst 235 as an initial layer to stimulate and promote the deposition of the first copper layer 230.

To perform operation 340 according to at least some embodiments, method 300 can further include a number of additional operations, including: (1) immersing the PCB into an acidic stannous chloride solution for between 40 to 60 seconds (e.g., approximately 50 seconds) at room temperature; (2) rinsing the PCB thoroughly in deionized water; (3) without waiting to dry, immersing the PCB into an acidic palladium chloride solution for 40 to 60 seconds (e.g., approximately 50 seconds) at room temperature and without agitating; (4) rinsing the PCB thoroughly in deionized water; (5) without allowing to dry, immersing the PCB 200 in an electroless copper solution for in excess of two minutes at one of room temperature or 40° Celsius; (6) rinsing the PCB 200 in deionized water; and (7) drying the PCB 200 with nitrogen ($N_2$). In some embodiments, in excess of two minutes is at least three minutes or more, which can result in the second copper of layer 240 being deposited of from 0.15 to 0.35 microns (μm) thick. In one embodiment, the second copper 240 layer is approximately 0.25 μm thick. Although specific thicknesses are disclosed by way of example, additional thickness in various sub-micron ranges are envisioned as would be apparent to those skilled in the art.

Figure 2D:
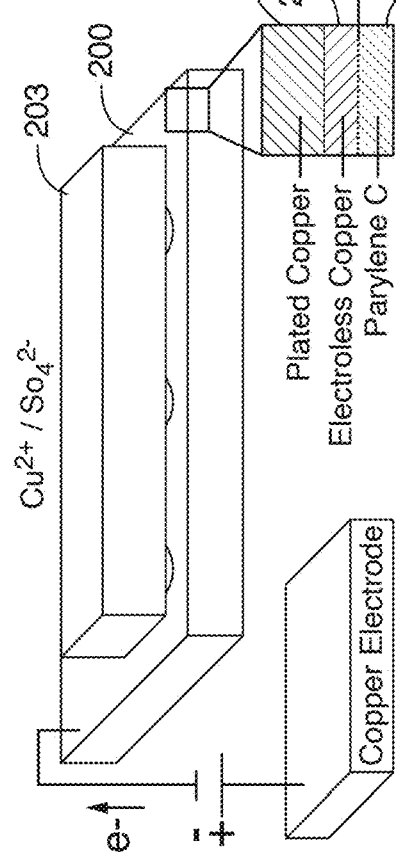

Operation 350 of method 300, as illustrated in FIG. 2D, includes depositing, using copper electroplating, a third copper layer 250 on the second copper layer. Operation 350 aims to increase the thickness of the copper layers deposited in previous steps, e.g., the first copper layer 230 and the second copper layer 240. Electroplating, or the cathodic deposition of copper is a well-developed technique to deposit good quality copper with precise rates that are fast relative to electroless deposition. In some embodiments, the electrolyte solution contains 0.2 moles (M) of Copper(II) sulfate ($CuSO_4$) and 1 M of sulfuric acid ($H_2SO_4$). A current density equal to 75 amperes per meters squared ($A/m^2$) or less can be used to prevent fragile porous copper deposition.

In some embodiments, operations 330 through 350 can be viewed as sub-operations designed to deposit multiple copper sublayers of a larger copper layer. For example, these copper sublayers can include at least a thermally-evaporated copper layer (operation 330), which can also be a thermally-sputtered copper layer, an electroless-deposited copper layer (operation 340), and an electroplated copper layer (operation 350). Differing amounts of copper can be deposited across these different copper layers 230, 240, and 250 to eventually created a single copper layer that advantageously stays adhered to the chromium layer that is in turn adhered to the electrical insulation layer 210.

Figures 4A, 4B, 4C:
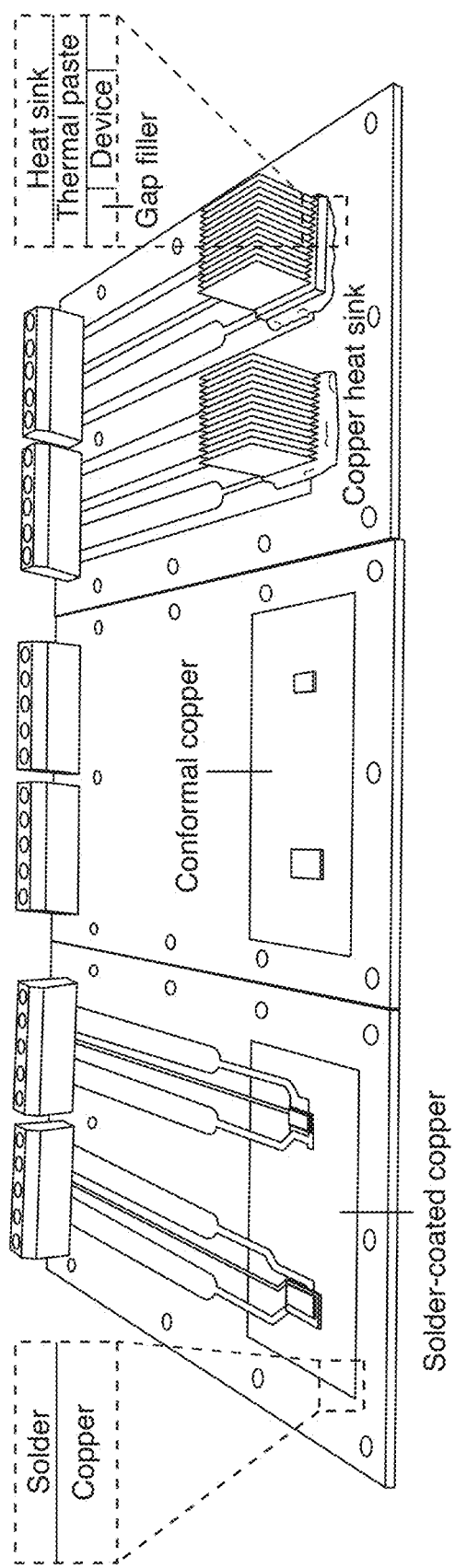
FIG. 4A is an image of a PCB that employs solder-coated copper to cool power components according to some embodiments.
FIG. 4B is an image of a PCB that employs conformal copper to cool power components according to some embodiments.
FIG. 4C is an image of a PCB that employs copper heat sinks to cool power components according to some embodiments.

FIG. 4A is an image of a PCB that employs solder-coated copper to cool power components, e.g., two GaN power transistors, according to some embodiments. The solder, for example, can be a thin layer of a metal alloy deposited on top of a previously laid copper layer. The metal alloy is sometimes lead or tin combined with brass and/or silver. This can be understood to be a conventional approach with which will be compared the embodiments of FIGS. 2A-2D and FIG. 3.

FIG. 4B is an image of a PCB that employs conformal copper to cool power components, e.g., the two GaN power transistors, according to some embodiments. As illustrated, the conformal copper coating is applied according to the embodiments of FIGS. 2A-2D and FIG. 3, and coatings of various copper thicknesses will be compared in experimental test results hereinafter.

FIG. 4C is an image of a PCB that employs copper heat sinks to cool power components, e.g., the two GaN power transistors, according to some embodiments. As illustrated, the heat sinks require thermal interface materials (gap filler and thermal paste) in the heat sink experiments to optimize thermal performance. While the heat sinks perform well, heat sinks are bulky, take up a lot of space, cannot be cooled in water, and are difficult to seal in thermal interface to the power components.

In performing the experiments using the approaches of FIGS. 4A-4B for purposes of performance comparisons, the GaN power transistors were powered and a period of time allowed to pass until the temperature of the GaN power transistors reached a steady state. The experiments were performed in quiescent air and quiescent water at about room temperature, or ~22° C. The experiments were similarly performed using the approach of FIG. 4C (with a heat sink), with the exception of the experiments performed in water.

Figures 5A, 5B, 5C, 5D:
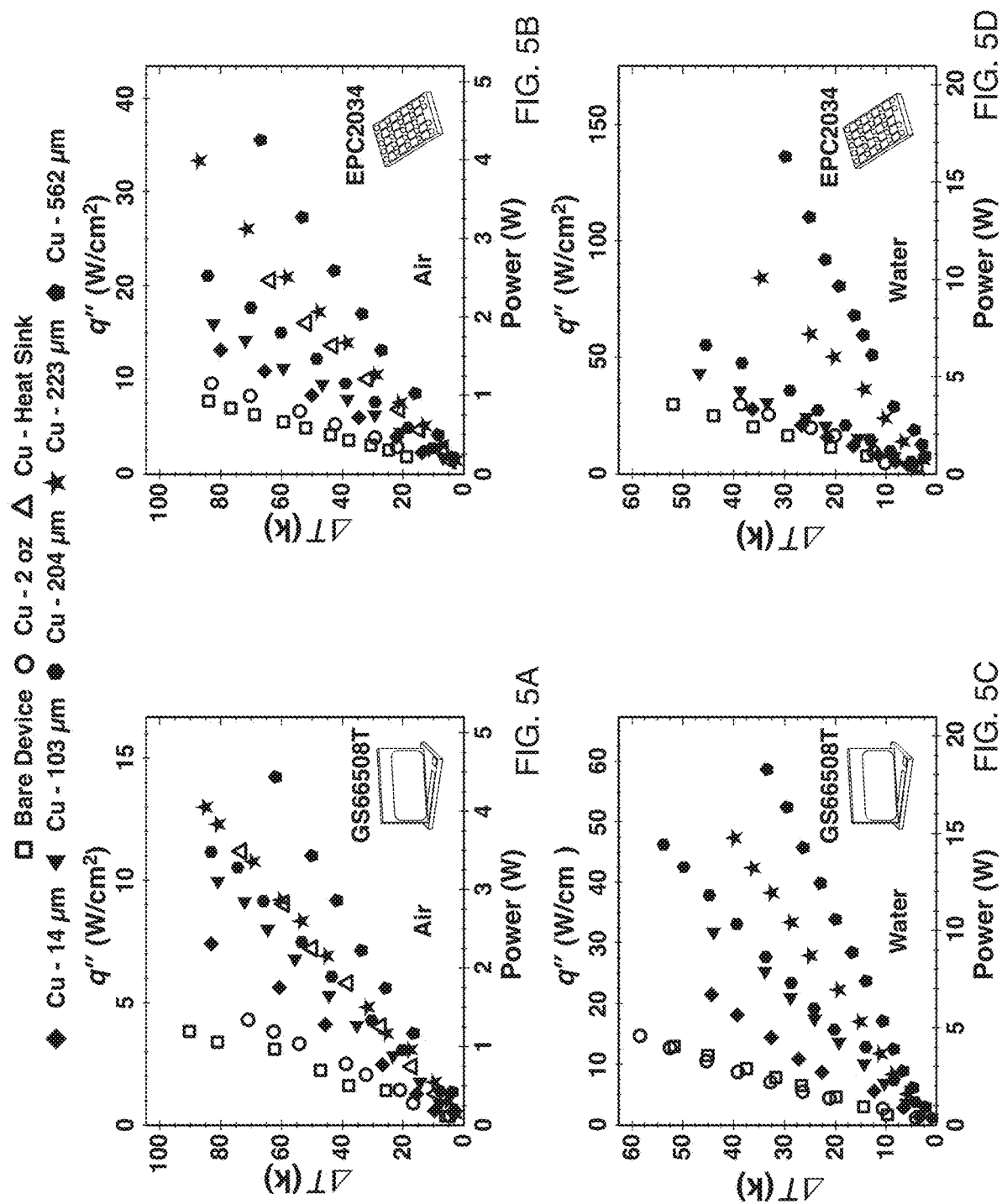
FIGS. 5A-5B are graphs of a change in temperature versus power dissipation of two separate experiments performed in air at room temperature, respectively, according to some embodiments.
FIGS. 5C-5D are graphs of a change in temperature versus power dissipation of two separate experiments performed in water at room temperature, respectively, according to some embodiments.

FIGS. 5A-5B are graphs of a change in temperature versus power dissipation of two separate experiments performed in air at room temperature, respectively, according to some embodiments. FIGS. 5C-5D are graphs of a change in temperature versus power dissipation of two separate experiments performed in water at room temperature, respectively, according to some embodiments. Results are compared between a bare device (e.g., no cooling implements), 2 oz. of Cu (FIG. 4A), Cu heat sinks (FIG. 4C), and then a series of multilayered coatings deposited as discussed with reference to FIGS. 2A-2D and FIG. 3 in which the final copper coatings vary between 14 µm to 562 µm in thickness, although other thickness ranges are envisioned, such as between 10 µm and 600 µm. While still thicker copper coatings are possible, it may be with increased risk of puncturing the electrical insulation layer.

With reference to the copper coatings, as can be observed, thermal resistance decreases with increased copper thickness (see FIGS. 6A-6D), allowing higher levels of power through the power components without as high a temperature increase, as the heat is dissipated through the copper coatings. The Cu coatings outperform the solder-coated copper plane and the heat sink. Although the heat sink outperforms thin Cu coatings, the heat sink involves disadvantages that were discussed with reference to FIG. 4C.

FIGS. 6A-6B are graphs of thermal resistance versus copper coating thickness in two separate experiments performed in air at room temperature, respectively, according to some embodiments. FIGS. 6C-6D are graphs of thermal resistance versus copper coating thickness in two separate experiments performed in water at room temperature, respectively, according to some embodiments. As illustrated, thermal resistance is graphed in R (in Kelvins per watt) along the left side and thermal insulance R" (in squared centimeters times Kelvins per watt) is graphed along the right side. In some embodiments, thermal resistance is calculated as the slope of the linear fitting of the change temperature versus power illustrated in FIGS. 5A-5D, respectively. As can be observed, thermal resistance is reduced in water compared to air, and is best reduced using the disclosed multilayered coatings, illustrated in FIG. 6D.

Figure 7A:
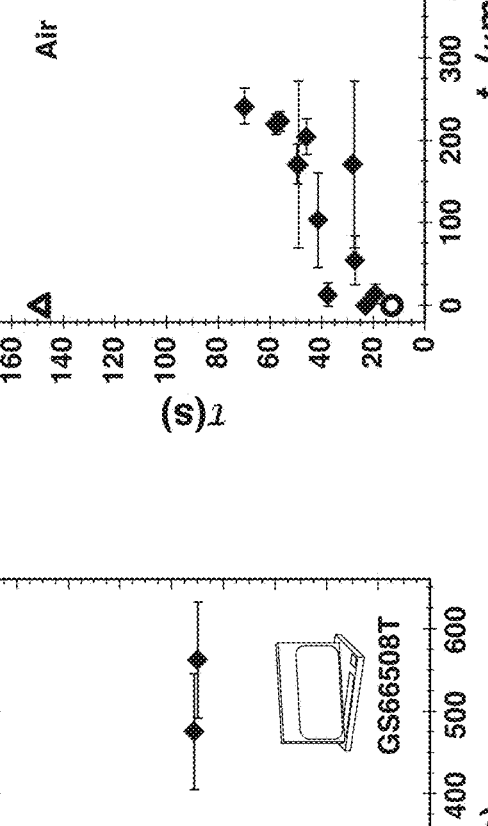
FIGS. 7A-7B are graphs of thermal time constant versus copper coating thickness in two separate experiments performed in air at room temperature, respectively, according to some embodiments.
Figure 7B:
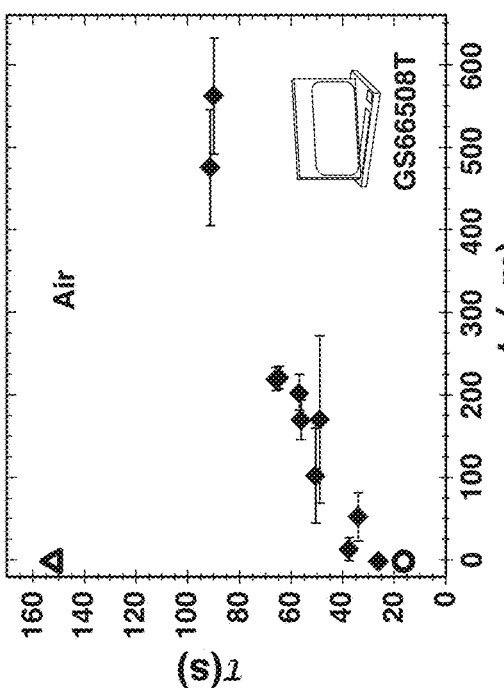
Figure 7C:
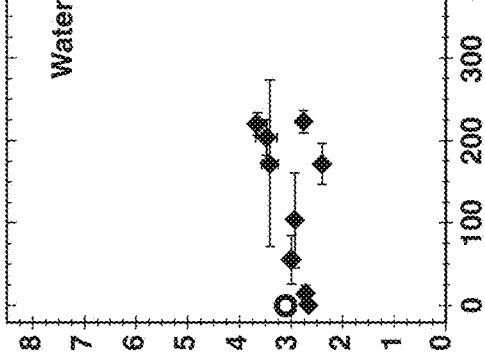
FIGS. 7C-7D are graphs of thermal time constant versus copper coating thickness in two separate experiments performed in water at room temperature, respectively, according to some embodiments.
Figure 7D:
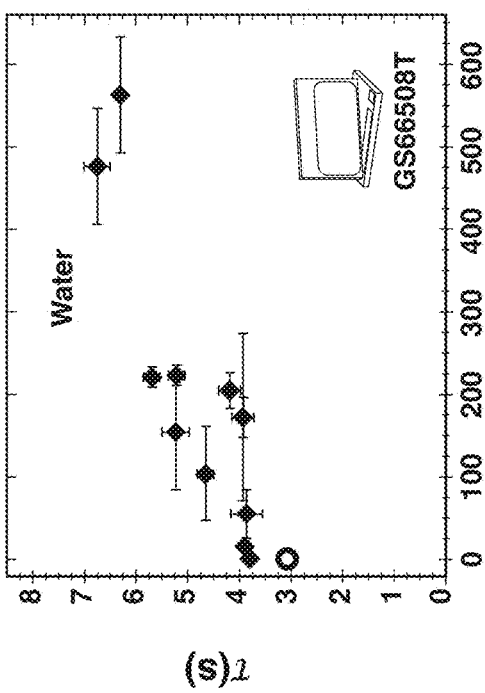

FIGS. 7A-7B are graphs of thermal time constant versus copper coating thickness in two separate experiments performed in air at room temperature, respectively, according to some embodiments. FIGS. 7C-7D are graphs of thermal time constant versus copper coating thickness in two separate experiments performed in water at room temperature, respectively, according to some embodiments. The variation of the heater spreader dimensionless temperature Θ vs. time was measured and the results were fitted to the double-phase exponential decay model, expressed in Equation (2), $$\Theta = \frac{T(t) - T_{amb}}{T_{max} - T_{amb}} = A_1 e^{-\frac{t}{\tau_d}} + A_2 e^{-\frac{t}{\tau_s}} + \Theta_0. \quad (2)$$

The thermal time constant $\tau_s$ quantifies the time needed to change the coating temperature. The results illustrate the potential use of copper coating heat spreaders in thermal stabilization applications. The thicker the copper layers in the Cu coating, the higher the thermal constant, and the slower the change in temperature. This effect is more pronounced in air.

Figure 8A:
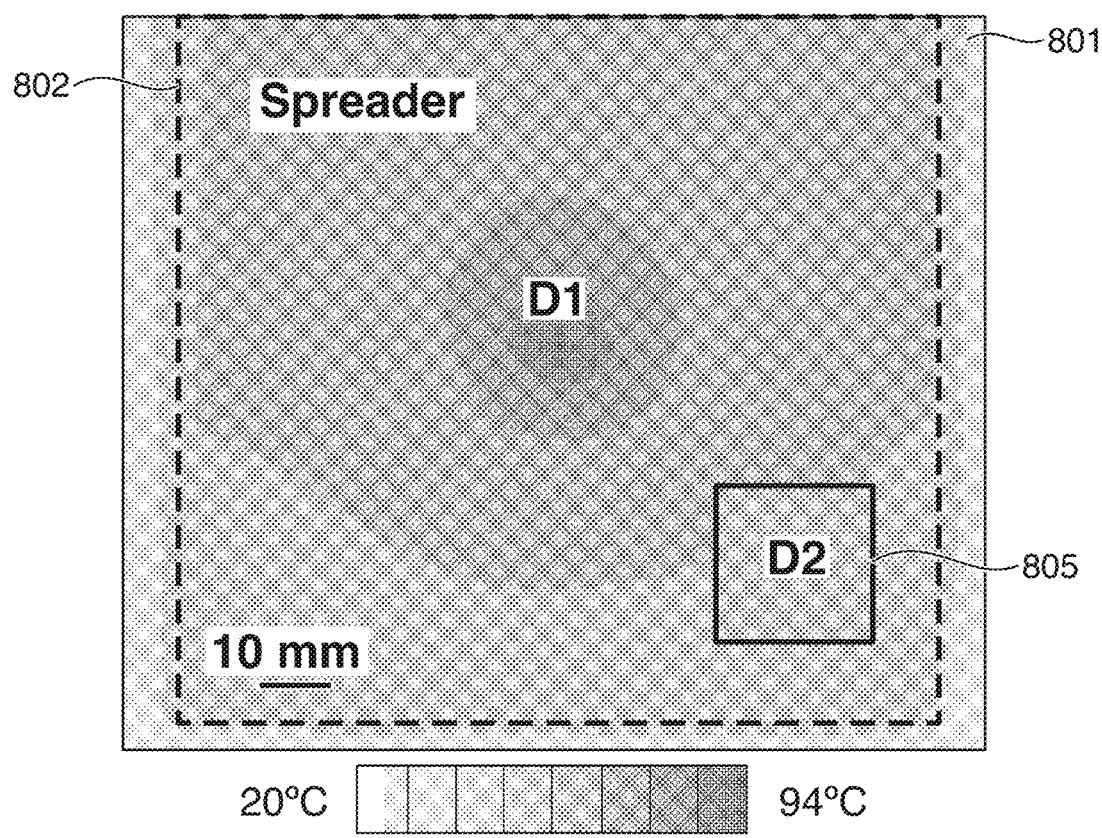
FIG. 8A is an image of a heat spreader that includes a heat shield region over an electronic device (D2) to be protected from heat radiated by a power component (DO according at least one embodiment.

FIG. 8A is an image of a heat spreader 802 that includes a heat shield region 805 over an electronic device D2 to be protected from heat radiated by a power component D1 according at least one embodiment. The heat spreader 802 is layered on top of the power component D1 which generates heat when powered. In some embodiments, a disclosed apparatus, device, or system, further includes an electronic device D2, disposed on a PCB 801, the electronic device D2 having a temperature limit that is lower than that of the power component D1. For example, silicon-based electronics (examples of D2) have lower temperature limits than those of GaN-based or SiC-based electronics (examples of D1). In these embodiments, the chromium and copper layers of the heat spreader 802 are prevented from covering the heat shield region 805 over the electronic device D2, e.g., through use of the mask that was discussed previously. The heat shield region 805 can be sized to protect the electronic device D2 from the heat dissipated by the heat spreader 802, e.g., to reduce the temperature the electronic device D2 to a target temperature.

In various embodiments, the copper coating of the heat spreader 802 reduces the temperature of the power component D1. Further, the heat shield region 805 of the copper coating is a shielded area that acts as a heat shield, reducing the temperature of D2. The absence of any heat-spreading device can act as a heat shield in many cases involving PCBs since FR-4 has a low thermal conductivity. The size of the heat shield can be designed to reach a target temperature of D2 that is within the limit in temperature of D2.

Figure 8B:
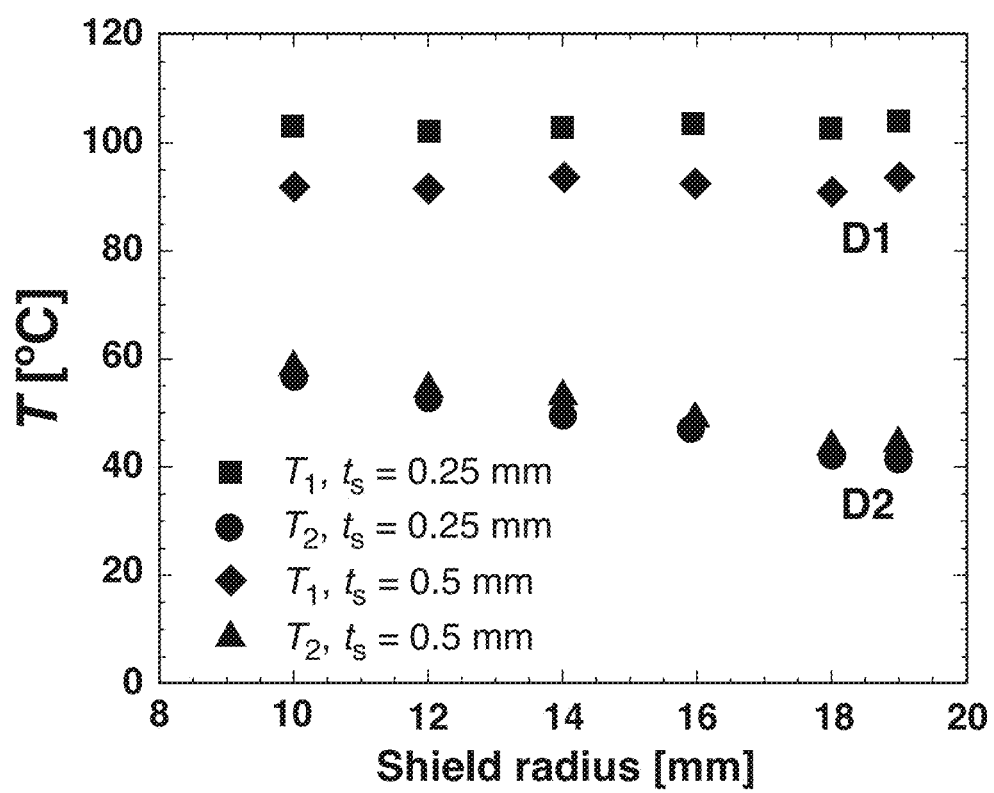
FIG. 8B is a graph of temperature versus an effective radius from a center of the electronic device (D2) to an edge of the heat shield region according to the at least one embodiment.

FIG. 8B is a graph of temperature versus an effective radius from a center of the electronic device (D2) according to the at least one embodiment. This radius can be understood as an effective radius (or distance from) the center of the passive electronic device D2 and that corresponds to a two-dimensional size of the shielded area 810. This graph illustrates maximum device temperatures (beneath the nonpolar electrical insulation) $T_1$ and $T_2$ corresponding to the active device D1 and the passive device D2, respectively, for varying $r_{sd}$ (the shield effective radius) and $t_s$ (the copper coating heat spreader thickness). The results are based on Finite Volume Method (FVM) simulations in air at 20° C. ambient temperature.

Figure 9A:
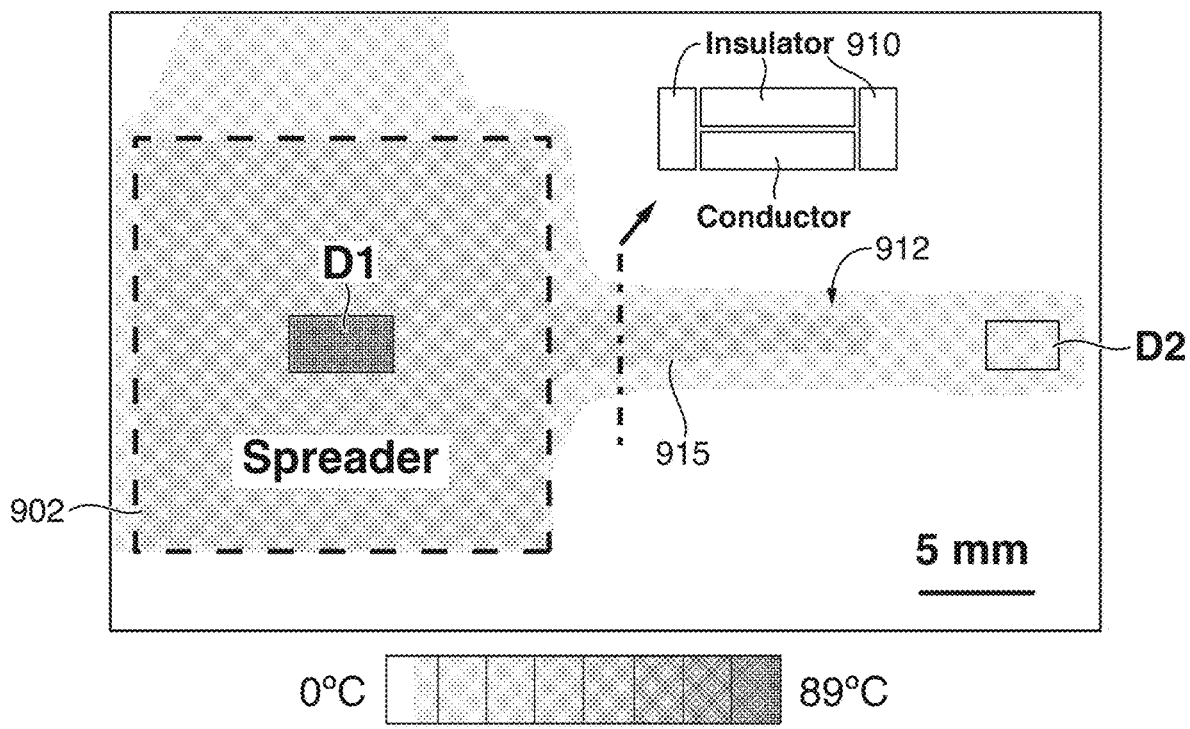
FIG. 9A is an image of a heat spreader attached to a heat router formed by a copper-based coating and thermal insulation layer between a power component and an electronic device that is to be heated by the power component according to at least one embodiment.

FIG. 9A is an image of a heat spreader 902 attached to a heat router 912 formed by a copper-based coating and a thermal insulation layer 910 between a power component D1, and an electronic device D2, that is to be heated by the power component D1, according to at least one embodiment. In various embodiments, the heat spreader 902 reduces the temperature of the power component D1 which generates heat when powered. In at least some embodiments, an apparatus, device, or system further includes the electronic device D2 that does not generate heat disposed on a PCB 901 a distance away from the power component D1. The multilayered coating covers an area of the PCB 901 adjacent to the power component D1 and a thermal routed path 915 of the heat router 912 of the PCB 901 between the power component D1 and the electronic device D2. In some embodiments, the distance away (or distance between D1 and D2) is at least 20 millimeters (mm), but other distances in the tens of millimeter range are envisioned, as would be apparent to those skilled in the art. In one embodiment, the mask (which is applied before coating the PCB 901 with the copper layer) defines the thermal routed path of the heat router 912.

In at least some embodiments, the heat router 912 includes the multilayered coating ("conductor" in the inset of FIG. 9A) along with the thermal insulation layer 910 ("insulator" in the inset of FIG. 9A) disposed on the multilayered coating. For example, the thermal insulation coating 910 can be an epoxy or another coating with low thermal conductivity. In some embodiments, the thermal insulation layer 910 is deposited on areas defined by a mask.

In these embodiments, the heat router 912 transfers heat from the power component D1 towards D2, the electronic device, to increase the temperature of the electronic device D2. This heat transfer can help in optimizing the performance of the electronic device D2 in cold environments. Thus, for example, the electronic device D2 can be an active battery, a passive power storage cell, or other active or passive devices.

Figure 9B:
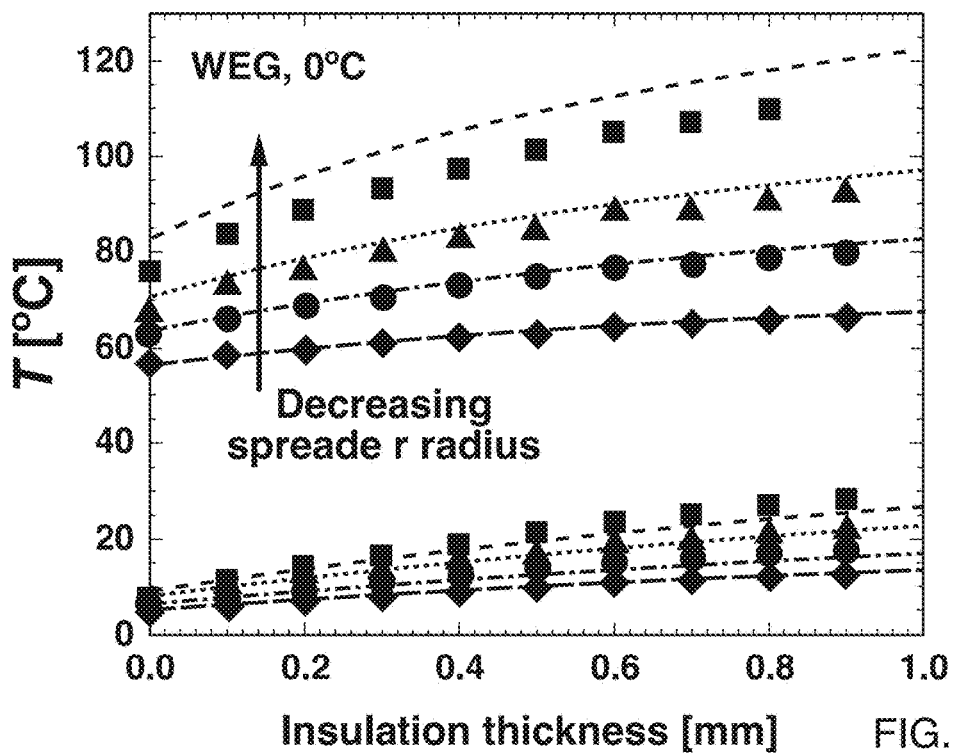
FIG. 9B is a graph of temperature versus thermal insulation thickness of the heat spreader and the heat router according to the at least one embodiment.

FIG. 9B is a graph of temperature versus thermal insulation thickness of the heat spreader and the heat router 912 according to the at least one embodiment. In some embodiments, the size of the heat spreader 902 and a thickness of a thermal insulator placed over the heat router 912 are designed so that the power component or device D1 is cooled to a particular first temperature and the electronic device D2 is heated to a particular second temperature. The graph of FIG. 9B illustrates maximum device temperatures (beneath the non-polar electrical insulation) $T_1$ (top 8 plots) and $T_2$ (bottom 8 plots), for varying $r_s$ (the spreader effective radius) and $t_{in}$ (the thermal insulation thickness). The results are based on Finite Volume Method (FVM—scatter points) and Reduced Order Model (ROM—dashed lines) simulations in a 50/50% in volume mixture of water and ethylene glycol at 0° C. ambient temperature. Other simulations of thermal performance of the heat spreader 902 and thermal insulation coating 910 were conducted in dielectric fluids, water, and a water-ethylene glycol mixture at ambient temperatures varying from 0° C. to 20° C. Other fluid and temperatures can be used as well.

Figure 10A:
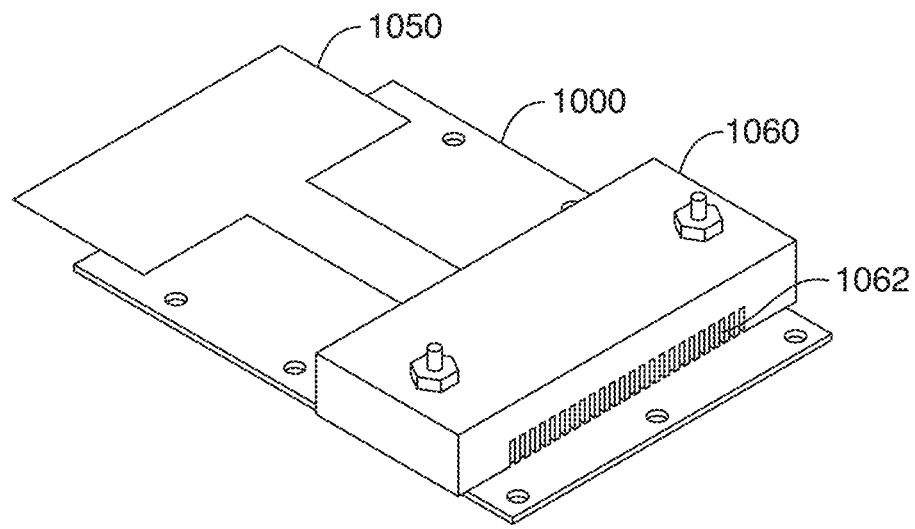
FIG. 10A is a perspective view of a side mask used to create fins or grooves within the electroplated copper layer of the disclosed thermal coatings according to some embodiments.

FIG. 10A is a perspective view of a side mask 1060 used to create fins or grooves within an electroplated copper layer 1050 of the disclosed thermal coatings according to some embodiments. The electroplated copper layer 1050 may correspond, for example, to the third copper layer 250 illustrated and discussed with reference to FIG. 2D. Because the electroplated copper layer 1050 is deposited on the first copper layer 230 and the second copper layer 240 (FIGS. 2C-2D), the electroplated copper layer 1050 may be understood to include underlying copper layers of a final copper layer, e.g., that results from the method 300 of FIG. 3. In some embodiments, the side mask 1060 is attached to a PCB 1000 over a power component and/or power electronics (not illustrated) such as the power component 203 of FIGS. 2A-2D. The side mask 1060 may include slots 1062 through which to receive electroplated copper and form fins or grooves (see FIG. 10C) out of the electroplated copper that is deposited.

Thus, in various embodiments, the depositing in operation 350 of the method 300 of FIG. 3 may include applying the mask 1060 over the second copper layer 240, the mask 1060 to create fins or grooves 1080 in the third copper layer 250, e.g., the electroplated copper layer 1050. The fins or grooves increase the surface area of the electroplated copper layer 1050, and thus also increasing the heat dissipation of the multilayered thermal coating (e.g., similar to advantages that finned heat sinks provide).

Figure 10B:
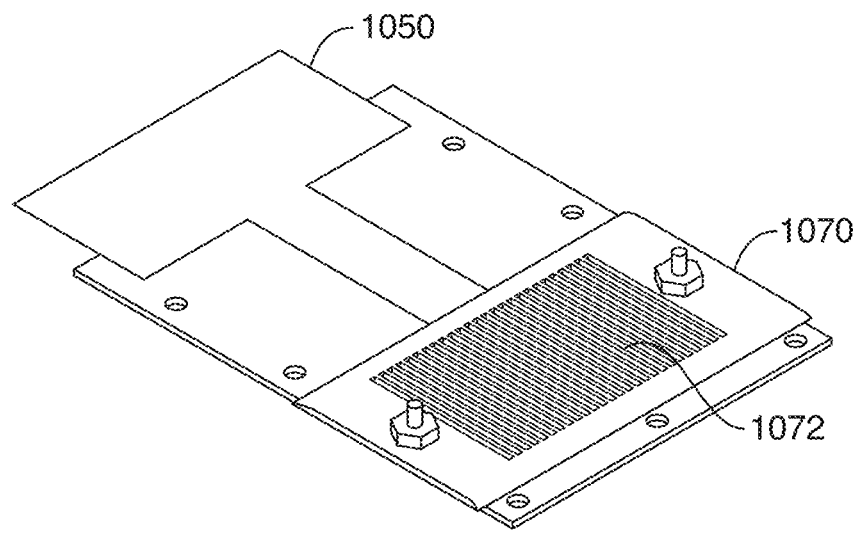
FIG. 10B is a perspective view of a top mask used to create fins or grooves within the electroplated copper layer of the disclosed thermal coatings according to some embodiments.
Figure 10C:
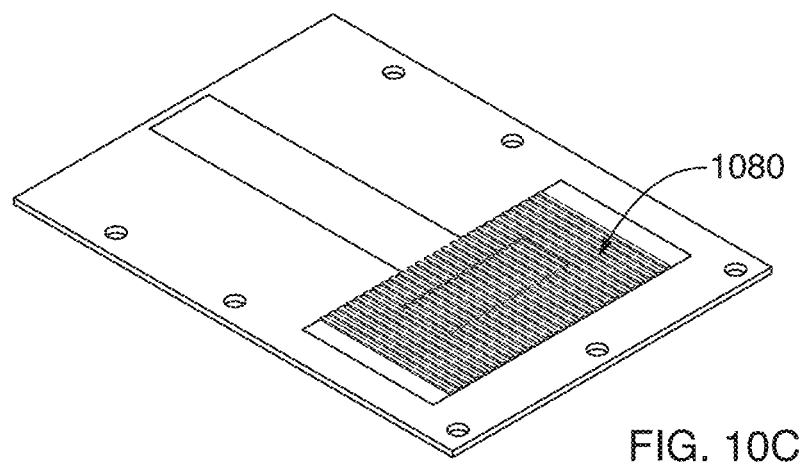
FIG. 10C is a perspective view of the resulting electroplated copper layer that contains the fins or grooves according to some embodiments.

FIG. 10B is a perspective view of a top mask 1070 used to create fins or grooves 1080 within the electroplated copper layer 1050 of the disclosed thermal coatings according to some embodiments. This top mask 1070 includes rectangular openings 1072 akin to a grate through which the electroplated copper can be received to form the fins or grooves 1080. FIG. 10C is a perspective view of the resulting electroplated copper layer 1050 that contains the fins or grooves 1080 according to some embodiments. FIGS. 10A-10C are simplified drawings to illustrate the concept of creating these fins or grooves, understanding that the PCB 1000 could be much more complicated, potentially larger, and the electroplated copper layer 1050 could be sized differently to cover a varying amount of power electronics.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus comprising:
    a printed circuit board (PCB);
    a power component disposed on the PCB, the power component to generate heat; and
    a multilayered coating disposed over the power component and at least a portion of the PCB to dissipate the heat from the power component, the multilayered coating comprising:
        an electrical insulation layer comprising a non-polar compound and disposed on the power component and the at least a portion of the PCB;
        a chromium layer disposed on the electrical insulation layer; and
        a copper layer disposed on the chromium layer that is at least 10 microns (μm) thick, the copper layer conformally adhered to a top of the power component and to the PCB.

2. The apparatus of claim 1, wherein the electrical insulation layer is from 7 to 11 microns (μm) thick.

3. The apparatus of claim 1, wherein the chromium layer is from 10 to 30 nanometer (nm) thick.

4. The apparatus of claim 1, wherein the copper layer comprises multiple copper sublayers comprising:
    a thermally-evaporated copper layer that is from 40 to 60 nm thick disposed on the chromium layer;
    an electroless-deposited copper layer that is from 0.15 to 0.35 μm thick disposed on the thermally-evaporated copper layer; and
    an electroplated copper layer disposed on the electroless-deposited copper layer.

5. The apparatus of claim 1, further comprising an electronic device disposed on the PCB that has a temperature limit lower a temperature limit of the power component, wherein the copper layer comprises a heat shield region over the electronic device, the heat shield region being sized to reduce a temperature of the electronic device to a target temperature.

6. The apparatus of claim 1, further comprising:
    an electronic device that is to be heated by the power component disposed on the PCB a distance away from the power component, wherein the multilayered coating covers an area of the PCB adjacent to the power component and a thermal routed path of the PCB between the power component and the electronic device; and
    a thermal insulation layer disposed on the multilayered coating.

7. The apparatus of claim 6, wherein the electronic device is a battery or a storage cell and the distance away comprises at least 20 millimeters.

8. The apparatus of claim 1, wherein the electrical insulation layer is a non-polar dielectric, Parylene C, Parylene HT, or Parylene N.

9. The apparatus of claim 1, wherein at least a portion of the copper layer comprises fins or grooves that increase a surface area of the copper layer.

10. A method comprising:
    coating a power component and at least a portion of a printed circuit board (PCB) on which the power component is disposed with an electrical insulation layer comprising a non-polar compound;
    depositing, using one of thermal evaporation or sputtering, a chromium layer on the electrical insulation layer;
    depositing, using one of thermal evaporation or sputtering, a first copper layer on the chromium layer;
    depositing, using electroless deposition, a second copper layer on the first copper layer; and
    depositing, using copper electroplating, a third copper layer on the second copper layer.

11. The method of claim 10, further comprising, before the coating, covering select components disposed on, and select areas of, the at least a portion of the PCB with a polyimide adhesive tape to protect the select components and select areas that are to be accessed during later PCB operations.

12. The method of claim 10, further comprising, after the coating, covering a region of the at least a portion of the PCB with a mask that is not to be layered with the chromium and copper layers.

13. The method of claim 12, wherein the mask defines a thermal routed path between the power component and an electronic device that is disposed on the at least a portion of the PCB a distance away from the power component, wherein the electronic device is to be heated by the power component, and the method further comprising, after deposition of the first and second copper layers, depositing a thermal insulation layer on the copper layers that are defined by the mask.

14. The method of claim 10, further comprising, before the coating:
    applying an adhesion promoter for the electrical insulation layer, the adhesion promoter comprising gamma-methacryloxypropyltrimethoxysilane (γ-MPS); and
    wherein the coating of the power component and the at least a portion of the PCB with the electrical insulation layer is done within 30 hours of applying the adhesion promoter.

15. The method of claim 10, wherein:
    the chromium layer is deposited until the chromium layer is 0 to 30 nanometer (nm) thick;
    the first copper layer is deposited until the first copper layer is 40 to 60 nm thick; and
    the second copper layer is deposited until the second copper layer is 0.15 to 0.35 μm thick.

16. The method of claim 10, wherein depositing the second copper layer comprises:
    immersing the PCB into an acidic stannous chloride solution for between 40 to 60 seconds at room temperature;
    rinsing the PCB thoroughly in deionized water;
    without waiting to dry, immersing the PCB into an acidic palladium chloride solution for 40 to 60 seconds at room temperature;
    rinsing the PCB thoroughly in the deionized water;
    without allowing to dry, immersing the PCB in an electroless copper solution for an excess of two minutes at one of room temperature or 40° Celsius;
    rinsing the PCB in the deionized water; and
    drying the PCB with nitrogen.

17. The method of claim 16, wherein the excess of two minutes comprises at least three minutes.

18. The method of claim 10, wherein the copper electroplating is performed using a current density of 75 amperes per meter squared or less to prevent fragile porous copper deposition.

19. The method of claim 10, further comprising employing a mask to form a heat shield region in the chromium layer and the first copper layer, wherein the second copper layer and the third copper layer are not deposited on the heat shield region, which defines a shielded area over an electronic device disposed on the PCB that has a temperature limit lower than a temperature limit of the power component, the heat shield region being sized to reduce a temperature of the electronic device to a target temperature.

20. The method of claim 10, wherein the electrical insulation layer is a non-polar dielectric, Parylene C, Parylene HT, or Parylene N.

21. The method of claim 10, wherein before the depositing, using the copper electroplating, applying a mask over the second copper layer, the mask to create fins or grooves in the third copper layer.

22. A device comprising:
a printed circuit board (PCB);
a power source;
power electronics disposed on the PCB that is to generate heat when powered by the power source; and
a multilayered coating disposed over the power electronics and at least a portion of the PCB to dissipate the heat from the power electronics, the multilayered coating comprising:
an electrical insulation layer comprising a non-polar compound and disposed on the power electronics and the at least a portion of the PCB;
a chromium layer disposed on the electrical insulation layer;
a thermally-evaporated copper layer deposited on the chromium layer;
an electroless-deposited copper layer deposited on the thermally-evaporated copper layer; and
an electroplated copper layer deposited on the electroless-deposited copper layer.

23. The device of claim 22, wherein the electroless-deposited copper layer and the electroplated copper layer are conformally adhered to the power electronics and the at least a portion of the PCB, and wherein the copper layers combined are from 10 µm to 600 µm thick.

24. The device of claim 22, wherein the electrical insulation layer is a non-polar dielectric, Parylene C, Parylene HT, or Parylene N.

25. The device of claim 22, wherein the electroplated copper layer comprises fins or grooves to increase a surface area of the electroplated copper layer.

* * * * *